US009533501B2

(12) United States Patent
Yazaki

(10) Patent No.: US 9,533,501 B2
(45) Date of Patent: Jan. 3, 2017

(54) LIQUID JET HEAD AND A LIQUID JET APPARATUS INCLUDING A PIEZOELECTRIC MATERIAL HAVING AN UPPER ELECTRODE AND A LOWER ELECTRODE

(71) Applicant: Seiko Epson Corporation, Shinjuku-ku (JP)

(72) Inventor: Shiro Yazaki, Chino (JP)

(73) Assignee: Seiko Epson Corporation, Tokyo (JP)

( * ) Notice: Subject to any disclaimer, the term of this patent is extended or adjusted under 35 U.S.C. 154(b) by 576 days.

(21) Appl. No.: 14/077,590

(22) Filed: Nov. 12, 2013

(65) Prior Publication Data

US 2014/0071206 A1 Mar. 13, 2014

Related U.S. Application Data

(63) Continuation of application No. 13/228,378, filed on Sep. 8, 2011, now Pat. No. 8,608,292, which is a (Continued)

(30) Foreign Application Priority Data

Jan. 24, 2008 (JP) ................................ 2008-014265

(51) Int. Cl.
*H01L 41/08* (2006.01)
*B41J 2/14* (2006.01)
*B41J 2/055* (2006.01)

(52) U.S. Cl.
CPC ............ *B41J 2/14209* (2013.01); *B41J 2/055* (2013.01); *B41J 2/14233* (2013.01); *B41J 2002/14241* (2013.01); *B41J 2002/14419* (2013.01)

(58) Field of Classification Search
CPC .................................................... B41J 2/14209
(Continued)

(56) References Cited

U.S. PATENT DOCUMENTS

| | | | |
|---|---|---|---|
| 6,336,717 | B1 | 1/2002 | Shimada et al. |
| 7,475,970 | B2 | 1/2009 | Sugahara |

(Continued)

FOREIGN PATENT DOCUMENTS

| | | |
|---|---|---|
| JP | 2005-088441 A | 4/2005 |
| JP | 2006-096034 A | 4/2006 |
| JP | 2007-118193 A | 5/2007 |

*Primary Examiner* — J. San Martin
(74) *Attorney, Agent, or Firm* — Kilpatrick Townsend & Stockton LLP

(57) ABSTRACT

A lower electrode 60 in a region opposite each of pressure generation chambers 12 is formed to have a width smaller than the width of the corresponding pressure generation chamber 12, and an upper surface and an end surface of the lower electrode 60 in a region corresponding to each of the pressure generation chambers 12 is covered with a piezoelectric material layer 70. An end surface of the piezoelectric material layer 70 forms a slope surface sloping downward toward the outside, an upper surface and an end surface of the piezoelectric material layer 70 in the region opposite each of the pressure generation chambers 12 are covered with an upper electrode 80, and a distance D1 between the upper surface of the lower electrode 60 and the upper surface of the piezoelectric material layer 70 and a distance D2 between the end surface of the lower electrode 60 and the end surface of the piezoelectric material layer 70 satisfy the relationship D2≥D1.

6 Claims, 10 Drawing Sheets

Related U.S. Application Data continuation of application No. 12/359,042, filed on Jan. 23, 2009, now Pat. No. 8,029,109.

(58) Field of Classification Search
USPC .................................................. 310/328, 324
See application file for complete search history.

(56) References Cited

U.S. PATENT DOCUMENTS

| | | | | |
|---|---|---|---|---|
| 7,637,600 | B2 | 12/2009 | Yazaki | |
| 7,739,777 | B2 | 6/2010 | Sugahara | |
| 8,672,455 | B2 * | 3/2014 | Ohashi | H01L 41/0815 347/68 |
| 2008/0012907 | A1 | 1/2008 | Takahashi | |
| 2008/0088207 | A1 * | 4/2008 | Li | B41J 2/14233 310/358 |
| 2008/0218556 | A1 * | 9/2008 | Seto | B41J 2/14233 347/50 |
| 2009/0231396 | A1 * | 9/2009 | Yazaki | B41J 2/055 347/71 |
| 2009/0284568 | A1 * | 11/2009 | Yazaki | B41J 2/055 347/68 |
| 2010/0079558 | A1 * | 4/2010 | Shimada | B41J 2/14233 347/71 |
| 2011/0169896 | A1 * | 7/2011 | Miyazawa | B41J 2/055 347/68 |
| 2011/0261120 | A1 * | 10/2011 | Shimizu | B41J 2/161 347/71 |
| 2012/0056945 | A1 * | 3/2012 | Nakayama | B41J 2/14233 347/68 |
| 2012/0200643 | A1 * | 8/2012 | Isshiki | B41J 2/14233 347/72 |
| 2014/0132676 | A1 * | 5/2014 | Yazaki | B41J 2/14201 347/71 |
| 2014/0240405 | A1 * | 8/2014 | Furuya | H01L 41/0973 347/71 |
| 2014/0267504 | A1 * | 9/2014 | Ohashi | H01L 41/0533 347/68 |
| 2015/0230333 | A1 * | 8/2015 | Yoda | C23F 1/02 174/255 |
| 2016/0005950 | A1 * | 1/2016 | Itayama | B41J 2/14233 347/68 |
| 2016/0067969 | A1 * | 3/2016 | Kakiuchi | B41J 2/161 347/70 |
| 2016/0096368 | A1 * | 4/2016 | Yazaki | B41J 2/14 347/70 |
| 2016/0152028 | A1 * | 6/2016 | Tanaka | B41J 2/14233 347/68 |

* cited by examiner

LIQUID JET HEAD AND A LIQUID JET APPARATUS INCLUDING A PIEZOELECTRIC MATERIAL HAVING AN UPPER ELECTRODE AND A LOWER ELECTRODE

This application is a continuation of U.S. patent application Ser. No. 13/228,378, filed Sep. 8, 2011, which is a continuation of U.S. patent application Ser. No. 12/359,042, filed Jan. 23, 2009, now U.S. Pat. No. 8,029,109, which claims priority to Japanese Patent Application No. 2008-014265, filed Jan. 24, 2008, the entireties of all which are incorporated by reference herein.

BACKGROUND OF THE INVENTION

Field of the Invention

The present invention relates to a liquid jet head that jets liquid droplets from nozzles by displacement of piezoelectric elements, and a liquid jet apparatus, and in particular, to an ink jet type recording head that jets ink droplets as liquid droplets, and an ink jet type recording apparatus.

Invention of Related Art

An ink jet type recording head, which is an example of a liquid jet head jetting liquid droplets, includes a flow channel forming plate having pressure generation chambers, and piezoelectric elements provided on one surface of the flow channel forming plate, each of the piezoelectric elements having a lower electrode, a piezoelectric material layer, and an upper electrode. Pressure is given into the pressure generation chambers by displacement of the piezoelectric elements, and ink droplets are jetted from nozzles. The piezoelectric elements, which are used in such an ink jet type recording head, are liable to be broken due to external environment, such as humidity or the like. In order to solve this problem, for example, the outer circumferential surface of the piezoelectric material layer is covered with the upper electrode (for example, see JP-A-2005-88441).

As described in Patent Document 1, if the piezoelectric material layer is covered with the upper electrode, the piezoelectric material layer can be prevented from being broken due to humidity. In this case, however, the upper electrode and the lower electrode at the end surface of the piezoelectric material layer become very close to each other. For this reason, insulation breakdown may occur between both electrodes, and the piezoelectric element may be broken.

SUMMARY OF THE INVENTION

An advantage of some aspects of the invention is that it provides a liquid jet head capable of preventing piezoelectric elements from being broken, and a liquid jet apparatus.

According to an aspect of the invention, a liquid jet head includes a flow channel forming plate having a pressure generation chamber to communicate with a nozzle ejecting liquid droplets, and a piezoelectric element provided above one surface of the flow channel forming plate, each of the piezoelectric elements having a lower electrode, a piezoelectric material layer, and an upper electrode. The lower electrode in a region opposite each of the pressure generation chamber has a width smaller than the width of the corresponding pressure generation chamber, and an upper surface and an end surface of the lower electrode in a region corresponding to the pressure generation chamber are covered with the piezoelectric material layer. An end surface of the piezoelectric material layer forms a slope surface sloping downward toward the outside, an upper surface and an end surface of the piezoelectric material layer in the region opposite the pressure generation chamber are covered with the upper electrode, and a distance D1 between the upper surface of the lower electrode and the upper surface of the piezoelectric material layer and a distance D2 between the end surface of the lower electrode and the end surface of the piezoelectric material layer satisfy the relationship $D2 \geq D1$.

In this aspect, the surface of the piezoelectric material layer opposite each of the pressure generation chamber is substantially covered with an upper electrode film. Therefore, the piezoelectric material layer can be prevented from being broken due to moisture in the atmosphere. In addition, if the relationship between the distance D1 and the distance D2 is satisfied, a sufficient interval between the lower electrode and the upper electrode constituting each piezoelectric element is secured. If an interval between the lower electrode and the upper electrode is secured such that the relationship is satisfied, insulation breakdown between the lower electrode and the upper electrode can be reliably suppressed.

The lower electrode may be provided independently to correspond to each of the pressure generation chambers so as to form an individual electrode of the piezoelectric element, and the upper electrode may be provided to successively extend in the arrangement direction of the pressure generation chambers so as to form a common electrode of a plurality of the piezoelectric elements. The lower electrode may form a common electrode of the piezoelectric elements, and the upper electrode may be divided by a partition wall between the pressure generation chambers so as to form an individual electrode of the piezoelectric element. With this configuration, the piezoelectric material layer can be reliably prevented from being broken, regardless of the electrode structure of the piezoelectric element.

One end portion of the lower electrode in a longitudinal direction of the pressure generation chamber may be located within a region opposite the corresponding pressure generation chamber, an end portion of the upper electrode in the longitudinal direction of each of the pressure generation chambers may be located within a region opposite the corresponding pressure generation chamber, and a substantial driving portion of the piezoelectric element is provided between the end portion of the lower electrode and the end portion of the upper electrode. With this configuration, there is no case in which a vibrating plate near both end portions in the longitudinal direction of the pressure generation chamber is deformed when the piezoelectric element is driven, and as a result, durability of the vibrating plate is improved.

A protective film made of a moisture-resistant material may be provided to cover an edge portion of the upper electrode and an exposed surface of the piezoelectric material layer in a region opposite to each of the pressure generation chambers. With this configuration, the piezoelectric material layer can be reliably prevented from being broken due to moisture in the atmosphere.

According to another aspect of the invention, a liquid jet apparatus includes the above-described liquid jet head. In this aspect, a reliable liquid jet apparatus that includes a head having improved durability can be realized.

Figure 1:
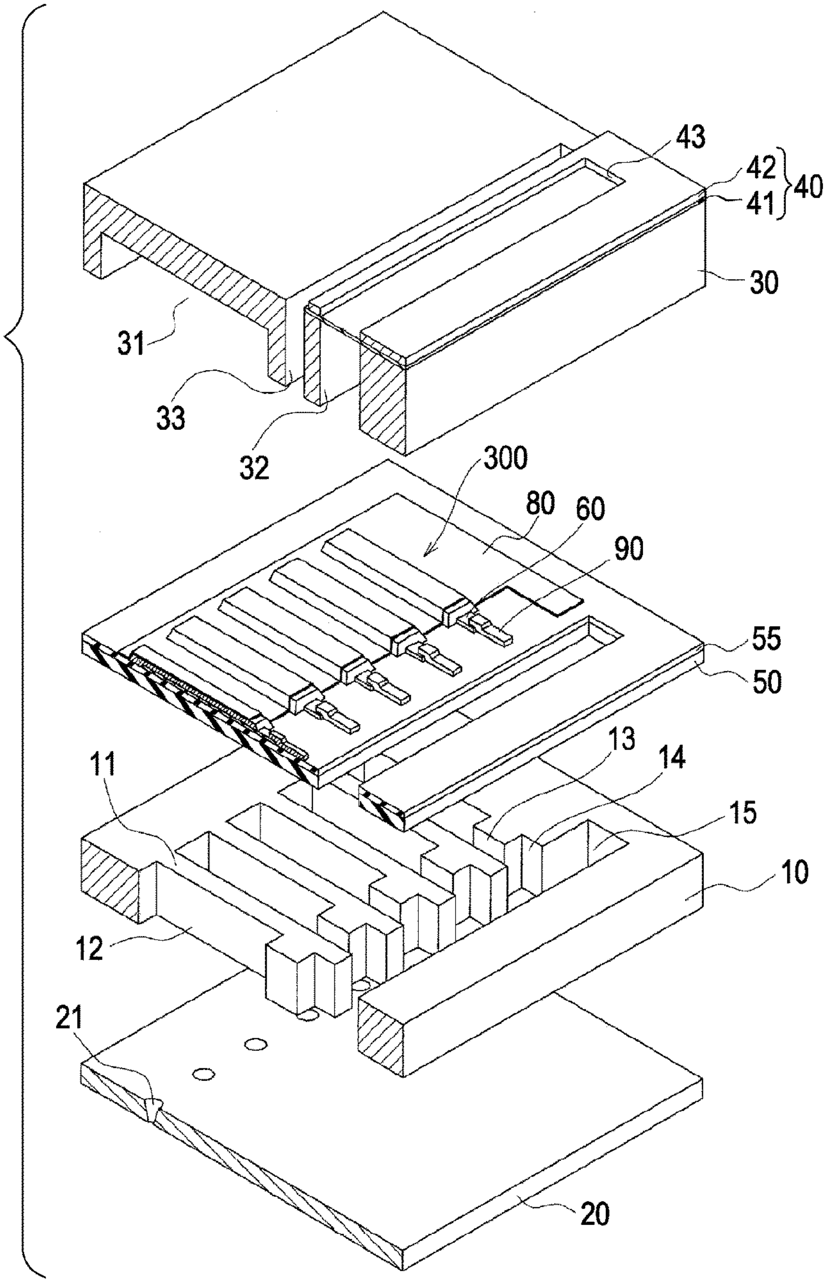
FIG. 1 is an exploded perspective view of a recording head according to a first embodiment of the invention.

10: flow channel forming plate
12: pressure generation chamber
20: nozzle plate
21: nozzle
30: protective plate
40: compliance plate
50: elastic film
55: insulator film
60: lower electrode film
70: piezoelectric material film
80: upper electrode film
100: reservoir
150: protective film
300: piezoelectric element

DESCRIPTION OF PREFERRED EMBODIMENTS

Hereinafter, embodiments of the invention will be described in detail.

First Embodiment

Figure 2:
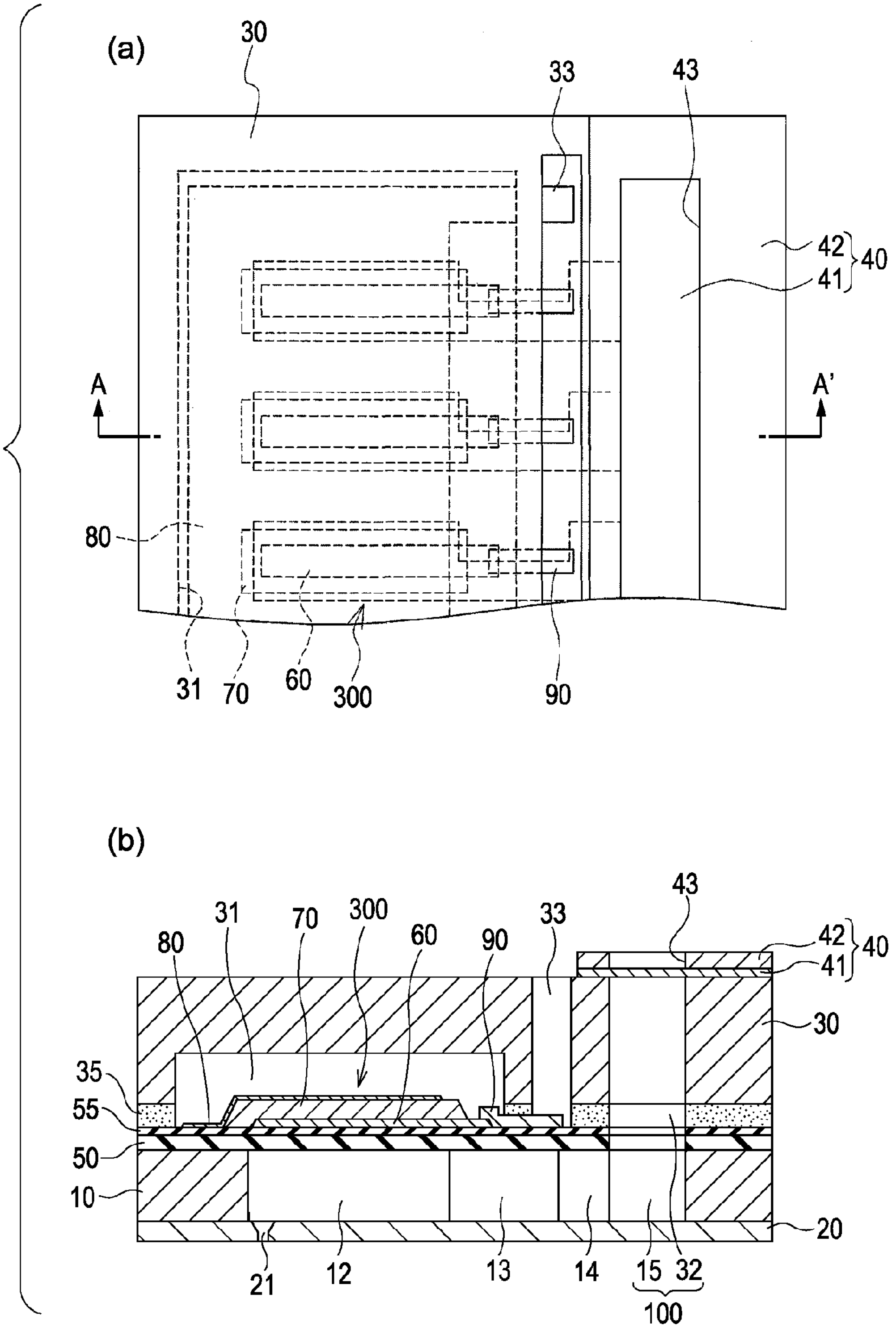
FIG. 2 is a plan view and a sectional view of the recording head according to the first embodiment of the invention.

FIG. 1 is an exploded perspective view showing the schematic configuration of an ink jet type recording head, which is an example of a liquid jet head, according to a first embodiment of the invention. FIG. 2 is a plan view of FIG. 1 and a sectional view taken along the line A-A' of FIG. 1.

As shown in the drawings, in this embodiment, a flow channel forming plate 10 is made of a silicon monocrystal plate having a crystal surface direction (110), and an elastic film 50 made of an oxide film is formed on one surface of the flow channel forming plate 10. In the flow channel forming plate 10, a plurality of pressure generation chambers 12 that are partitioned by a partition wall 11 are arranged in a width direction of the flow channel forming plate 10. The elastic film 50 forms one surface of each of a plurality of pressure generation chambers 12.

The flow channel forming plate 10 is provided with an ink supply channel 13 and a communicating channel 14, which are partitioned by the partition wall 11 to communicate with a corresponding one of the pressure generation chambers 12, at an end portion of the corresponding pressure generation chamber 12. A communicating portion 15 is provided to communicate with the communicating channel 14 outside the communicating channel 14. The communicating section 15 communicates with a reservoir portion 32 of a protective plate 30 that will be described below, and forms a part of a reservoir 100 serving as a common ink chamber (liquid chamber) of the pressure generation chambers 12.

The ink supply channel 13 is formed to have a section area smaller than that of the corresponding pressure generation chamber 12, and maintains flow channel resistance of ink flowing into the pressure generation chamber 12 from the communicating portion 15 constant. For example, the ink supply channel 13 is formed to have a width smaller than the width of the pressure generation chamber 12 by narrowing a flow channel near the pressure generation chamber 12 between the reservoir 100 and the pressure generation chamber 12. In this embodiment, the ink flow channel is formed by narrowing the width of the flow channel on one side, but the ink flow channel may be formed by narrowing the width of the flow channel on both sides. Alternatively, the ink flow channel may be narrowed in a thickness direction, instead of being formed by narrowing the width of the flow channel. The communicating channels 14 are formed by extending the partition wall 11 on both sides of the pressure generation chamber 12 in its width direction toward the communicating portion 15 and partitioning a space between the ink supply channel 13 and the communicating portion 15.

As the material of the flow channel forming plate 10, in this embodiment, a silicon monocrystal plate is used, but the invention is not limited thereto. For example, glass ceramics, stainless steel, or the like may be used.

A nozzle plate 20 is fixed onto an opening surface side of the flow channel forming plate 10 by an adhesive or a thermally welding film. The nozzle plate 20 is provided with nozzles 21, each of the nozzles 21 communicating with an end portion of the pressure generation chamber 12 opposite to the ink supply channel 13. The nozzle plate 20 is made of, for example, glass ceramics, a silicon monocrystal plate, stainless steel, or the like.

On a side of the opening surface of the flow channel forming plate 10, as described above, the elastic film 50 is formed. An insulator film 55 made of an oxide film different from the elastic film 50 is formed on the elastic film 50. Piezoelectric elements 300 each having a lower electrode film 60, a piezoelectric material layer 70, and an upper electrode film 80 are formed on the insulator film 55. Each of the piezoelectric elements 300 includes a portion having at least the piezoelectric material layer 70, as well as a portion having the lower electrode film 60, the piezoelectric material layer 70, and the upper electrode film 80. In general, one electrode of each of the piezoelectric elements 300 serves as a common electrode, and the other electrode is patterned for each of the pressure generation chambers 12, together with the piezoelectric material layer 70, and is formed as an individual electrode. The piezoelectric elements 300 and a vibrating plate, which is displaced when the piezoelectric elements 300 are driven, are collectively called an actuator device. In the above example, the elastic film 50, the insulator film 55, and the lower electrode film 60 serve as a vibrating plate. Alternatively, only the lower electrode film 60 may remain while the elastic film 50 and the insulator film 55 are not provided. In this case, the lower electrode film 60 serves as a vibrating plate. The piezoelectric element 300 itself may substantially serve as a vibrating plate.

Figure 3:
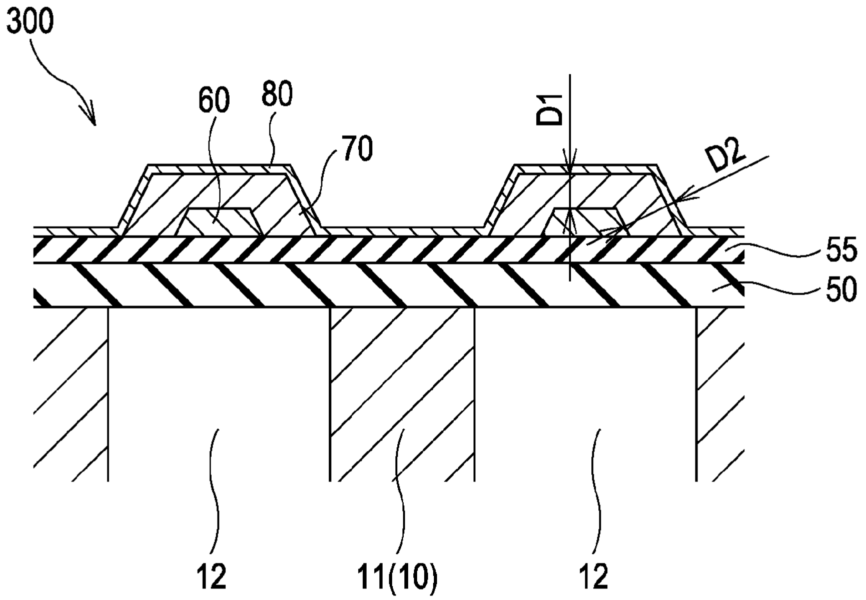
FIG. 3 is a sectional view showing the configuration of a piezoelectric element according to the first embodiment of the invention.

The structure of each of the piezoelectric elements 300 according to this embodiment will now be described in detail. As shown in FIG. 3, the lower electrode film 60 constituting each of the piezoelectric elements 300 is provided in a region corresponding to each of the pressure generation chambers 12 to have a width smaller than the width of the corresponding pressure generation chamber 12, thereby forming an individual electrode of the corresponding piezoelectric element 300. The lower electrode film 60 extends from one end portion in a longitudinal direction of each of the pressure generation chamber 12 onto a peripheral wall. A lead electrode 90 made of, for example, gold (Au) or the like is connected to the lower electrode film 60 outside the corresponding pressure generation chamber 12, and voltage is selectively applied to the corresponding piezoelectric element 300 through the lead electrode 90. An end portion of the lower electrode film 60 at the other end portion in the longitudinal direction of the pressure generation chamber 12 is located within a region opposite the pressure generation chamber 12.

The piezoelectric material layer 70 is provided to have a width larger than the width of the lower electrode film 60 and smaller than the width of each of the pressure generation chambers 12. In the longitudinal direction of the pressure generation chamber 12, both end portions of the piezoelectric material layer 70 extend outside the end portions of the pressure generation chamber 12. That is, the piezoelectric material layer 70 is provide to completely cover an upper surface and an end surface of the lower electrode film 60 in the region opposite the pressure generation chamber 12. An end portion of the piezoelectric material layer 70 at one end portion in the longitudinal direction of the pressure generation chamber 12 is located near the end portion of the pressure generation chamber 12, and the lower electrode film 60 further extends outside the end portion of the piezoelectric material layer 70.

The upper electrode film 80 is formed successively over regions opposite a plurality of pressure generation chambers 12, and extends from the other end portion in the longitudinal direction of each of the pressure generation chambers 12 to the peripheral wall. That is, the upper electrode film 80 is provided to substantially completely cover an upper surface and an end surface of the piezoelectric material layer 70 in the region opposite the pressure generation chamber 12. With this configuration, moisture (humidity) in the atmosphere is substantially prevented from entering the piezoelectric material layer 70. Therefore, the piezoelectric element 300 (the piezoelectric material layer 70) can be prevented from being broken due to moisture (humidity), and durability of the piezoelectric element 300 can be significantly improved.

An end portion of the upper electrode film 80 at the other end portion in the longitudinal direction of each of the pressure generation chambers 12 is located within the region opposite the pressure generation chamber 12, and a substantial driving portion of each of the piezoelectric elements 300 is provided within the region opposite the pressure generation chamber 12. That is, a portion of the piezoelectric element 300 between the end portion of the lower electrode film 60 and the end portion of the upper electrode film 80 located within the pressure generation chamber 12 become a substantial driving portion. For this reason, there is no case in which, even if the piezoelectric element 300 is driven, the vibrating plates (the elastic film 50 and the insulator film 55) near both end portions in the longitudinal direction of the pressure generation chamber 12 is significantly deformed. Therefore, the vibrating plate can be prevented from being cracked. In this configuration, the surface of the piezoelectric material layer 70 is slightly exposed within the region opposite the pressure generation chamber 12, but the area of the exposed surface is small. In addition, as described below, since a distance between an edge portion of the upper electrode film 80 and the lower electrode film 60 is large, the piezoelectric material layer 70 can be prevented from being broken due to moisture.

Figure 4:
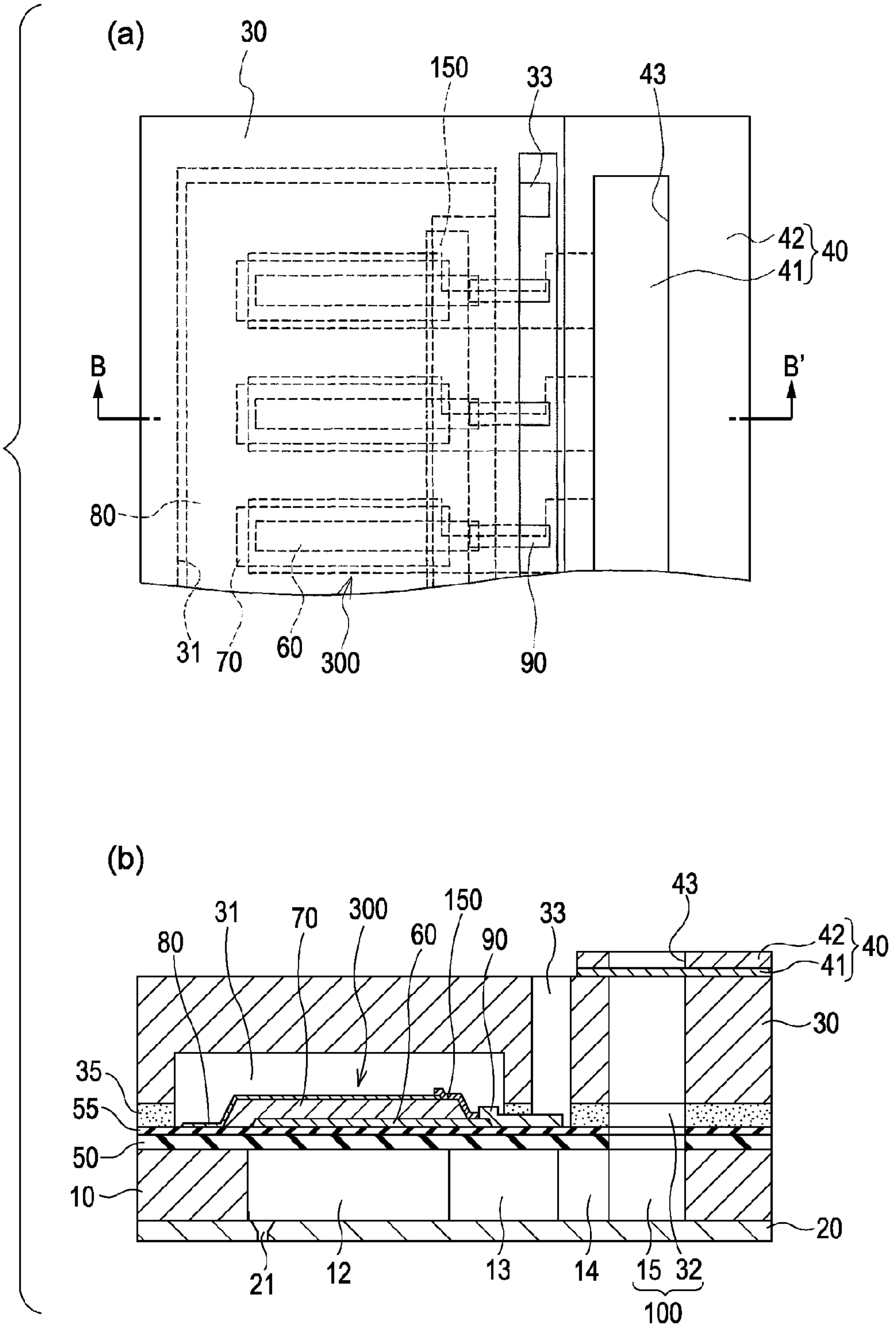
FIG. 4 is a plan view and a sectional view showing a modification of the recording head according to the first embodiment of the invention.

As shown in FIG. 4, a protective film 150 made of, for example, a moisture-resistant material, such as aluminum oxide or the like, may be provided to cover an edge portion of the upper electrode film 80 and an exposed surface of the piezoelectric material layer 70 in the region opposite the pressure generation chamber 12. Therefore, the piezoelectric material layer 70 can be reliably prevented from being broken due to moisture.

According to the embodiment of the invention, the thicknesses of respective portions of the piezoelectric material layer 70 constituting the piezoelectric element 300 satisfy the following relationship. Specifically, the thickness of the piezoelectric material layer 70 on the upper surface of the lower electrode film 60, that is, a distance D1 between the upper surface of the lower electrode film 60 and the upper surface of the piezoelectric material layer 70, and the thickness of the piezoelectric material layer 70 on the slope end surface of the lower electrode film 60, that is, a distance D2 between the end surface of the lower electrode film 60 and the end surface of the piezoelectric material layer 70, satisfy the relationship D2 D1 (see FIG. 3). That is, the thickness D2 of the piezoelectric material layer 70 on the end surface of the lower electrode film 60 is set so as to be equal to or larger than the thickness D1 of the piezoelectric material layer 70 on the upper surface of the lower electrode film 60, which contributes to driving of the piezoelectric element 300.

With this configuration, a sufficient interval between the upper electrode film 80 on the end surface of the piezoelectric material layer 70 and the lower electrode film 60 is secured. For this reason, insulation breakdown between the upper electrode film 80 and the lower electrode film 60 can be suppressed. Therefore, the piezoelectric element 300 can be prevented from being broken, and as a result, an ink jet type recording head having improved durability can be realized.

A protective plate 30 is bonded to the flow channel forming plate 10 having the piezoelectric elements 300 by an adhesive 35. The protective plate 30 has a piezoelectric element holding portion 31 in which a space can be secured in a region opposite each of the piezoelectric element 300 to such an extent as not to obstruct the movement of the piezoelectric element 300. The piezoelectric element 300 is formed within the piezoelectric element holding portion 31, and is protected so as not to be substantially influenced by the external environment. The protective plate 30 is provided with the reservoir portion 32 in a region corresponding to the communicating portion 15 of the flow channel forming plate 10. In this embodiment, the reservoir portion 32 is provided to pass through the protective plate 30 in its thickness direction and to extend along the arrangement direction of the pressure generation chambers 12. As described above, the reservoir portion 32 communicates with the communicating portion 15 of the flow channel forming plate 10, thereby forming the reservoir 100 serving a common ink chamber of the pressure generation chambers 12.

A through hole 33 is provided in a region between the piezoelectric element holding portion 31 and the reservoir portion 32 of the protective plate 30 to pass through the protective plate 30 in its thickness direction. The end portions of the lower electrode film 60 and the lead electrode 90 are exposed through the through hole 33. Though not shown, the lower electrode film 60 and the lead electrode 90 are connected to a driving IC for driving the piezoelectric elements 300 or the like through connection wires provided in the through hole 33.

As the material of the protective plate 30, for example, glass, a ceramics material, a metal, resin, or the like may be used. Preferably, the protective plate 30 is made of a material having the same thermal expansion coefficient as the flow channel forming plate 10 is used. In this embodiment, the protective plate 30 is made of the same material as the flow channel forming plate 10, that is, a silicon monocrystal plate.

A compliance plate 40 having a seal film 41 and a fixed plate 42 is bonded onto the protective plate 30. The seal film 41 is made of a flexible material having low rigidity. One surface of the reservoir portion 32 is sealed by the seal film 41. The fixed plate 42 is made of a hard material, such as a metal or the like. A region of the fixed plate 42 opposite the reservoir 100 is completely removed in a thickness direction of the fixed plate 42, thereby forming an opening 43. One surface of the reservoir 100 is sealed only by the flexible seal film 41.

In such an ink jet type recording head of this embodiment, ink is supplied from an external ink supply unit (not shown), and filled from the reservoir 100 to the nozzles 21. Voltage is applied to the piezoelectric elements 300 corresponding to the pressure generation chamber 12 in accordance with a recording signal from the driving IC (not shown), and the piezoelectric elements 300 are deformed in a deflection manner. Accordingly, pressure in the pressure generation chambers 12 increases, and thus ink droplets are ejected from the nozzles 21.

Second Embodiment

Figure 5:
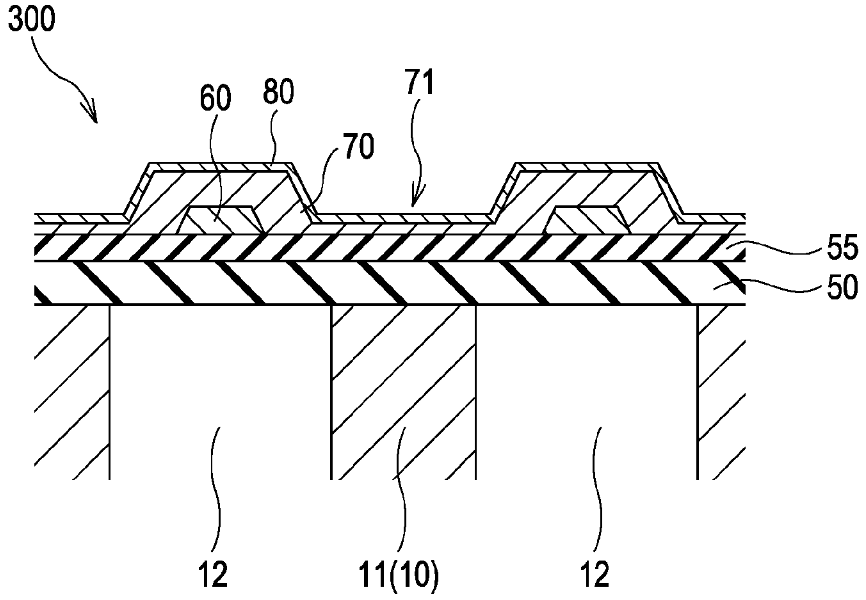
FIG. 5 is a sectional view showing the configuration of a piezoelectric element according to a second embodiment of the invention.

FIG. 5 is a sectional view showing the configuration of a piezoelectric element according to a second embodiment of the invention. As shown in FIG. 5, in this embodiment, the piezoelectric material layer 70 is formed successively to extend over a plurality of pressure generation chambers 12 arranged. That is, the second embodiment is the same as the first embodiment, except that a piezoelectric material layer 71 remains between the arranged piezoelectric elements 300 to have a thickness smaller than that of the piezoelectric material layer 70 constituting the piezoelectric elements 300. The thickness of the piezoelectric material layer 71 is not particularly limited, and may be appropriately set depending on the displacement of each of the piezoelectric elements 300.

In this way, if the piezoelectric material layer 70 is provided successively, the vibrating plate, that is, the elastic film 50 and the insulator film 55 can be prevented from being broken when the piezoelectric element 300 is driven. The vibrating plates near both end portions in a width direction of each of the pressure generation chambers 12 are largely deformed when the piezoelectric element 300 is driven, and a crack is liable to occur. In contrast, if the piezoelectric material layer 70 is provided successively, rigidity of the vibrating plate can be substantially improved, and thus the vibrating plate can be prevented from being cracked.

As described above, the edge portion of the upper electrode film 80 and the exposed surface of the piezoelectric material layer 70 are preferably covered with the protective film 150 (see FIG. 4).

Third Embodiment

Figure 6:
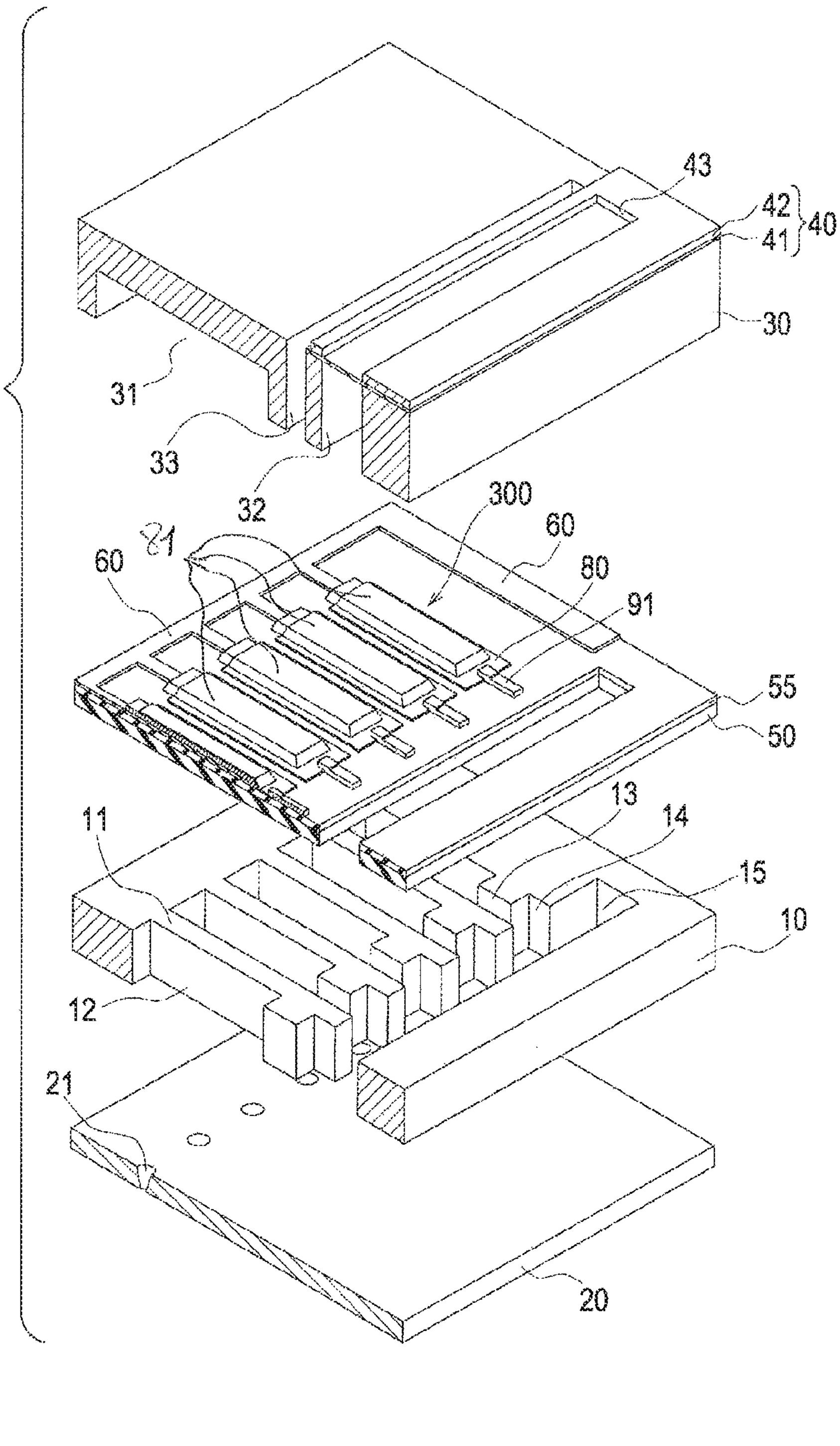
FIG. 6 is an exploded perspective view of a recording head according to a third embodiment of the invention.
Figure 7:
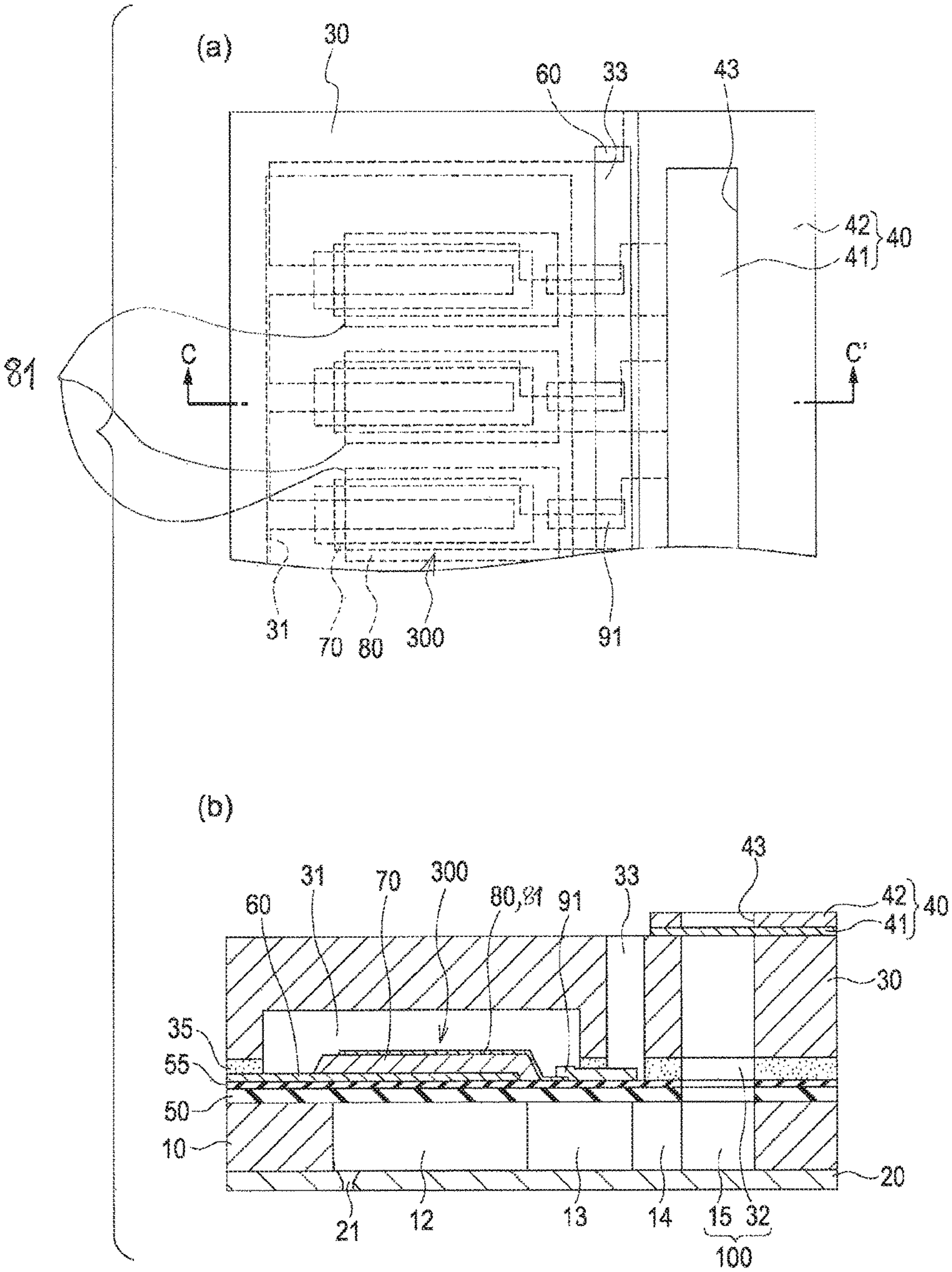
FIG. 7 is a plan view and a sectional view of the recording head according to the third embodiment of the invention.
Figure 8:
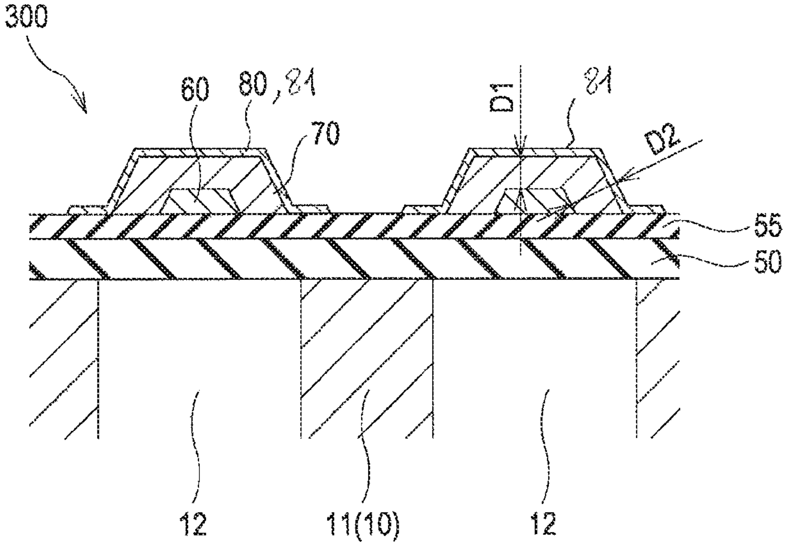
FIG. 8 is a sectional view showing the configuration of a piezoelectric element according to the third embodiment of the invention.

FIG. 6 is an exploded perspective view showing the schematic configuration of an ink jet type recording head according to a third embodiment of the invention. FIG. 7 is a plan view of FIG. 6, and a sectional view taken along the line C-C' of FIG. 6. FIG. 8 is a sectional view showing the configuration of a piezoelectric element according to the third embodiment of the invention. The same members as the members shown in FIGS. 1 to 3 are represented by the same reference numerals, and descriptions thereof will be omitted.

This embodiment is the same as the first embodiment, except that lower electrode films 60 constituting the piezoelectric elements 300 forms a common electrode film of the piezoelectric elements 300, and upper electrode films 80 form individual electrodes.

As shown in the drawings, the lower electrode film 60 of this embodiment extends from one end portion in the longitudinal direction of each of the pressure generation chambers 12 to the peripheral wall to have a width smaller than the width of the pressure generation chamber 12 in the region opposite the pressure generation chamber 12. The lower electrode films 60 are connected to each other on the partition wall to form a common electrode common to the piezoelectric elements 300. An end portion of the lower electrode film 60 at the other end portion in the longitudinal direction of the pressure generation chamber 12 is located within the region opposite the pressure generation chamber 12.

The piezoelectric material layer 70 extends outside both end portions in the longitudinal direction of the pressure generation chamber 12, and the upper surface and the end surface of the lower electrode film 60 are completely covered with the piezoelectric material layer 70 in the region opposite the pressure generation chamber 12. The lower electrode film 60 extends outside the piezoelectric material layer 70 at one end portion in the longitudinal direction of the pressure generation chamber 12.

The upper electrode film 80 is provided independently in the region opposite the corresponding pressure generation chamber 12 to have a width larger than the piezoelectric material layer 70. That is, the upper electrode film 80 is divided by the partition wall 11 between the pressure generation chambers 12, thereby forming the individual electrode 81 of the corresponding piezoelectric elements 300. The upper electrode film 80 extends from the other end portion in the longitudinal direction of the pressure generation chamber 12 to the peripheral wall. Accordingly, the upper surface and the end surface of the piezoelectric material layer 70 in the region opposite the pressure generation chamber 12 are substantially completely covered with the upper electrode film 80.

In this embodiment, the upper electrode film 80 extends outside the end portion of the piezoelectric material layer 70 at the other end portion in the longitudinal direction of the corresponding pressure generation chamber 12. A lead electrode 91 is connected to near the end portion of the upper electrode film 80, and voltage is selectively applied to the corresponding piezoelectric element 300 through the lead electrode 91.

In the configuration of this embodiment, similarly, the distance D1 between the upper surface of the lower electrode film 60 and the upper surface of the piezoelectric material layer 70 and the distance D2 between the end surface of the lower electrode film 60 and the end surface of the piezoelectric material layer 70 satisfy the relationship D2≥D1 (see FIG. 8). That is, the thickness D2 of the piezoelectric material layer 70 on the end surface of the lower electrode film 60 is set so as to be equal to or larger than the thickness D1 of the piezoelectric material layer 70 formed on the upper surface of the lower electrode film 60, which contributes to driving of the piezoelectric element 300.

In the configuration of this embodiment, similarly, the piezoelectric elements 300 can be prevented from being broken due to moisture. That is, the piezoelectric material layer can be prevented from being broken, regardless of the electrode structure of the piezoelectric element, and thus an ink jet type recording head having improved durability can be realized.

Figure 9:
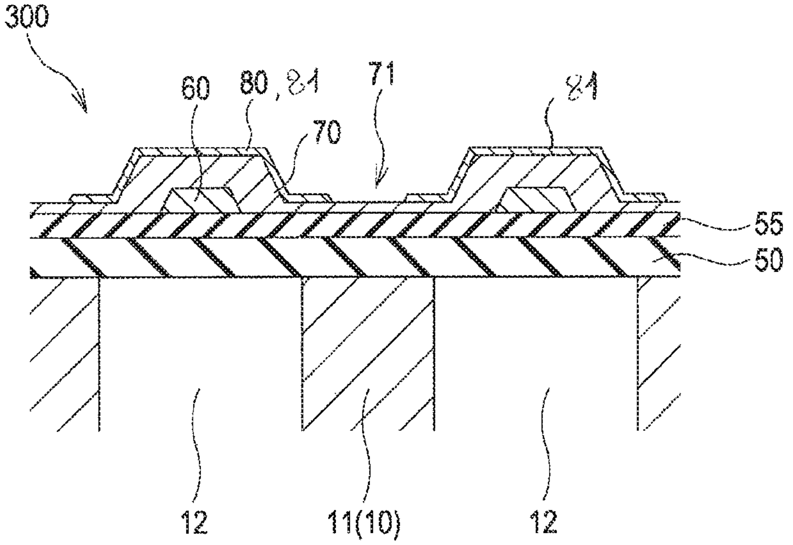
FIG. 9 is a sectional view showing a modification of the configuration of the piezoelectric element according to the third embodiment of the invention.

In the configuration of this embodiment, as shown in FIG. 9, the piezoelectric material layer 71 may remain to have a thickness smaller than the piezoelectric material layer 70 between the arranged piezoelectric elements 300. That is, the piezoelectric material layer 70 may be formed successively to extend over a plurality of pressure generation chambers 12 arranged.

Figure 10:
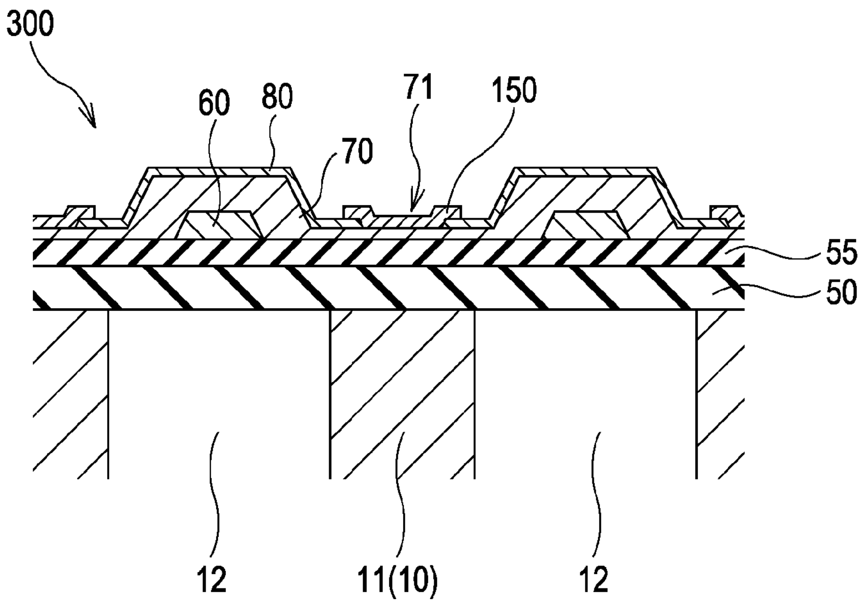
FIG. 10 is a sectional view showing a modification of the configuration of the piezoelectric element according to the third embodiment of the invention.

In such a configuration, as described above, the end portion of the upper electrode film 80 and the exposed surface of the piezoelectric material layer 70 are preferably covered with the protective film 150. In the configuration of this embodiment, as shown in FIG. 10, the exposed surface of the piezoelectric material layer 71 on the partition wall 11 between the pressure generation chambers 12 is preferably covered with the protective film 150. The piezoelectric material layer 71 on the partition wall 11, that is, outside the pressure generation chamber 12 does not directly contribute to displacement of the piezoelectric element 300. For this reason, the exposed surface of the piezoelectric material layer 71 on the partition wall 11 is not necessarily covered with the protective film 150. Meanwhile, if the exposed surface of the piezoelectric material layer 71 on the partition wall 11 is covered with the protective film 150, the piezoelectric material layer 70 constituting the piezoelectric element 300 can be reliably prevented from being broken, and the piezoelectric element 300 can be constantly and satisfactorily displaced.

Other Embodiments

Although the embodiments of the invention have been described, the invention is not limited to the foregoing embodiments.

Figure 11:
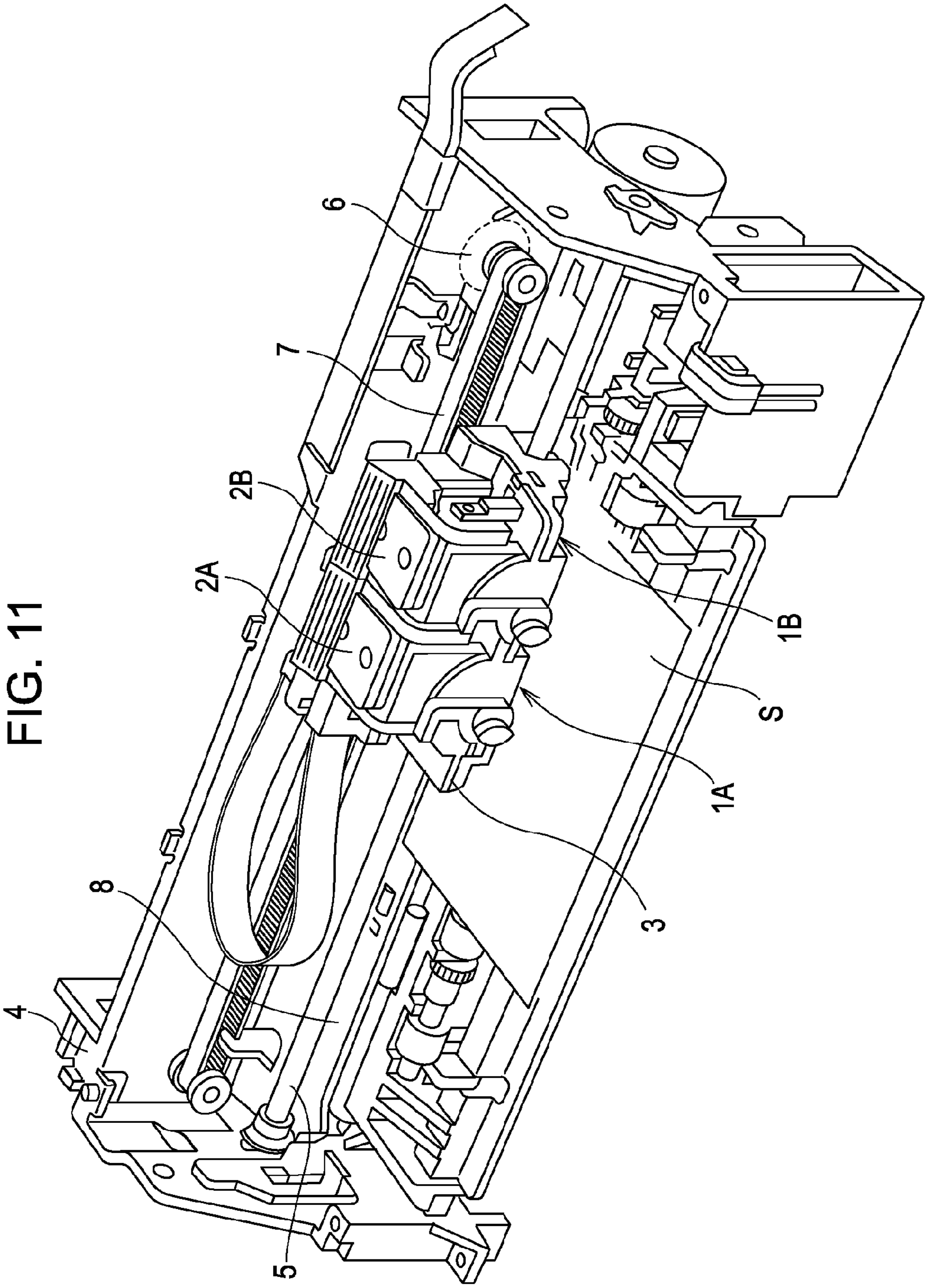
FIG. 11 is a schematic view of a recording apparatus according to an embodiment of the invention.

In the above-described embodiments, the ink jet type recording head forms a part of a recording head unit having an ink flow channel communicating with an ink cartridge or the like, and mounted on the ink jet type recording apparatus. FIG. 11 is a schematic view showing an example of the ink jet type recording apparatus. As shown in FIG. 11, cartridges 2A and 2B constituting an ink supply unit are detachably provided in recording head units 1A and 1B each having the ink jet type recording head, respectively. A carriage 3 on which the recording head units 1A and 1B are mounted is provided to be axially movable along a carriage shaft 5 attached to the apparatus main body 4. The recording head units 1A and 1B eject, for example, a black ink composition and a color ink composition, respectively. A driving force of a driving motor 6 is transmitted to the carriage 3 through a plurality of gears (not shown) and a timing belt 7, and the carriage 3 with the recording head units 1A and 1B mounted thereon moves along the carriage shaft 5. A platen 8 is provided in the apparatus main body 4 along the carriage shaft 5. A recording sheet S, which is a recording medium, such as paper or the like, fed by a sheet feed roller (not show) or the like, is transported on the platen 8.

In the above-described embodiments, the ink jet type recording head has been described as an example of a liquid jet head of the invention, the basic configuration of the liquid jet head is not limited to the above-described configuration. The invention is widely intended for overall liquid jet head, and it may be, of course, applied to a head jetting a liquid other than ink. Examples of the liquid jet heads include, for example, various recording heads used for an image recording apparatus, such as a printer or the like, a color material jet head that is used to manufacture a color filter of a liquid crystal display or the like, an electrode material jet head that is used to form an electrode of an organic EL display, an FED (Field Emission Display), or the like, a bioorganic jet head that is used to manufacture a bio-chip, and the like.

What is claimed is:

1. A liquid jet head comprising:

a flow channel forming plate having a pressure generation chamber to communicate with a nozzle ejecting liquid droplets; and a piezoelectric element provided above one surface of the flow channel forming plate, the piezoelectric element having a lower electrode, a piezoelectric material layer, and an upper electrode, wherein the lower electrode in a region opposite the pressure generation chamber has a width smaller than the width of the corresponding pressure generation chamber, and an upper surface and an end surface of the lower electrode in the region corresponding to the pressure generation chamber are covered with the piezoelectric material layer, and an end surface of the piezoelectric material layer forms a slope surface sloping downward toward the outside, an upper surface and an end surface of the piezoelectric material layer in the region opposite the pressure generation chamber are covered with the upper electrode, and a distance D1 between the upper surface of the lower electrode and the upper surface of the piezoelectric material layer and a distance D2 between the end surface of the lower electrode and the end surface of the piezoelectric material layer satisfy the relationship D2≥D1.

2. The liquid jet head according to claim 1, wherein the lower electrode is provided to correspond to the pressure generation chambers so as to form an individual electrode of the piezoelectric element, and the upper electrode is provided to successively extend in the arrangement direction of the pressure generation chambers so as to form a common electrode of a plurality of piezoelectric elements.

3. The liquid jet head according to claim 1, wherein the lower electrode forms a common electrode of the piezoelectric elements, and the upper electrode is divided at an area corresponding to a partition wall between the pressure generation chambers so as to form an individual electrode of each of the piezoelectric elements.

4. The liquid jet head according to claim 1, wherein one end portion of the lower electrode in a longitudinal direction of the pressure generation chamber is located within a region opposite the corresponding pressure generation chamber, an end portion of the upper electrode in the longitudinal direction of each of the pressure generation chambers is located within a region opposite the corresponding pressure generation chamber, and a substantial driving portion of the piezoelectric element is provided between the end portion of the lower electrode and the end portion of the upper electrode.

5. The liquid jet head according to claim 4, wherein a protective film made of a moisture-resistant material is provided to cover an edge portion of the upper electrode and an exposed surface of the piezoelectric material layer in a region opposite to the pressure generation chamber.

6. A liquid jet apparatus comprising the liquid jet head according to claim 1.

* * * * *